(12) United States Patent
Vogt et al.

(10) Patent No.: US 9,584,115 B2
(45) Date of Patent: Feb. 28, 2017

(54) DUTY CYCLE-CONTROLLED LOAD SWITCH

(71) Applicant: TEXAS INSTRUMENTS INCORPORATED, Dallas, TX (US)

(72) Inventors: Justin Patrick Vogt, Richardson, TX (US); Susan Ann Curtis, Allen, TX (US); David John Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/741,208

(22) Filed: Jun. 16, 2015

(65) Prior Publication Data
US 2015/0365087 A1 Dec. 17, 2015

Related U.S. Application Data

(60) Provisional application No. 62/013,335, filed on Jun. 17, 2014.

(51) Int. Cl.
| | |
|---|---|
| H03K 3/00 | (2006.01) |
| H03B 1/00 | (2006.01) |
| H03K 7/08 | (2006.01) |
| H03K 17/687 | (2006.01) |
| H02M 1/08 | (2006.01) |
| H02M 3/07 | (2006.01) |
| H02M 1/00 | (2006.01) |

(52) U.S. Cl.
CPC ............ *H03K 17/687* (2013.01); *H02M 1/08* (2013.01); *H02M 3/07* (2013.01); *H02M 2001/0048* (2013.01); *Y02B 70/1491* (2013.01)

(58) Field of Classification Search
CPC .............................. H03K 17/687; H02M 3/07
USPC ........ 327/108–112, 427, 434, 437, 170–175, 327/156–159, 536; 326/82, 83, 87
See application file for complete search history.

(56) References Cited

U.S. PATENT DOCUMENTS

| | | | | |
|---|---|---|---|---|
| 5,426,334 A | * | 6/1995 | Skovmand ............ | H02M 3/073 323/349 |
| 5,828,245 A | * | 10/1998 | Brambilla ............ | H03K 17/163 327/108 |
| 2009/0160533 A1 | * | 6/2009 | Lee ........................ | G11O 5/145 327/536 |
| 2010/0148840 A1 | * | 6/2010 | Weng .................... | H02M 3/073 327/291 |

* cited by examiner

*Primary Examiner* — Lincoln Donovan
*Assistant Examiner* — Thomas Skibinski
(74) *Attorney, Agent, or Firm* — Lawrence J. Bassuk; Charles A. Brill; Frank D. Cimino

(57) ABSTRACT

A switch includes a power transistor configured to switch an input voltage to a load. The switch further includes a charge pump and a duty cycle controller. The charge pump is coupled to the power transistor and includes an enable input to cause the charge pump to be turned on and off. The duty cycle controller is coupled to the charge pump and is configured to duty cycle the charge pump based on a comparison of a signal of a gate of the power transistor to a reference signal.

14 Claims, 3 Drawing Sheets

DUTY CYCLE-CONTROLLED LOAD SWITCH

CROSS-REFERENCE TO RELATED APPLICATIONS

The present application claims priority to U.S. Provisional Patent Application No. 62/013,335, filed Jun. 17, 2014, titled "A Circuit to Measure, Regulate, And Protect Power MOSFET Channel Resistance in Applications with Wide Operating Supply Voltage," which is hereby incorporated herein by reference in its entirety.

BACKGROUND

A load switch is a solid state device that can be controlled to turn power on and off to a load. An input voltage received by the load switch is selectively switched on and off to the load in response to a control signal. Thus, the voltage to be provided to the load is also the same voltage that is used to power and operate the load switch itself. Some load switches include p-type metal oxide semiconductor (pMOS) transistors as the active switching device in the load switch. Because a pMOS transistor is turned on with a low gate voltage, load switches built around a pMOS transistor typically do not include a charge pump circuit that otherwise might be needed to generate a sufficiently high voltage for the gate if an n-type MOS (nMOS) transistor were to be used instead of a pMOS transistor.

BRIEF DESCRIPTION OF THE DRAWINGS

For a detailed description of various examples, reference will now be made to the accompanying drawings in which.

SUMMARY

Figure 1:
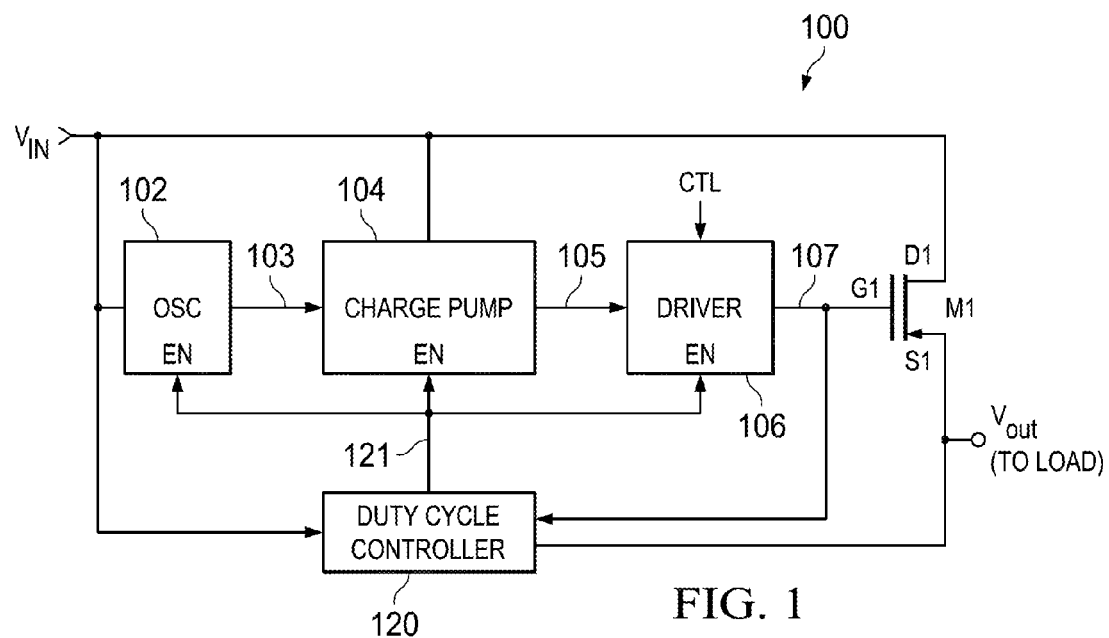
FIG. 1 shows a load switch in accordance with an embodiment.

In some embodiments, a switch includes a power transistor configured to switch an input voltage to a load. The switch further includes a charge pump and a duty cycle controller. The charge pump is coupled to the power transistor and includes an enable input to cause the charge pump to be turned on and off. The duty cycle controller is coupled to the charge pump and is configured to duty cycle the charge pump based on a comparison of a signal of a gate of the power transistor to a reference signal.

Another embodiment is directed to and apparatus that includes a load and a power transistor coupled to the load and configured to switch an input voltage to the load to power the load. The apparatus also includes a charge pump coupled to the power transistor. The charge pump includes an enable input to cause the charge pump to be turned on and off. A comparator is also provide and coupled to the charge pump and configured to generate an enable signal to the charge pump to turn the charge pump on and off based on a comparison of a signal of a gate of the power transistor to a reference signal to duty cycle the charge pump.

Yet another embodiment is directed to a method that includes receiving a signal indicative of a voltage of a gate of a power transistor configured to switch an input voltage to a load. The method further includes comparing the signal indicative of the gate voltage to a reference signal. The method also includes duty cycling a charge pump configured to turn on the power transistor based on the comparison of the signal indicative of the gate voltage to the reference signal.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

As noted above, some load switches may have used pMOS power transistors. A pMOS transistor is turned on with a low gate voltage. All else being equal, compared to nMOS transistors, pMOS transistors are characterized by a higher drain-to-source channel resistance. For a device to function as a load switch, it would be better to have the lowest possible channel resistance for improved power efficiency. An nMOS transistor with its relatively low channel resistance can be used as the active switching element in a load switch, but nMOS transistors are turned on with a gate voltage that is higher than the source voltage. Because the drain voltage may be the input voltage itself to be provided through the transistor to the load, an nMOS transistor can only be turned on if its gate voltage is higher than the input voltage. As such, if an nMOS transistor were to be used, a charge pump circuit may be needed to increase the gate voltage above that of the drain voltage of the nMOS. The disadvantage of including a charge pump is that the charge pump itself consumes power. In sum, using a pMOS transistor advantageously avoids the need for a charge pump circuit and thus is a simpler implementation, but has a higher channel resistance which hurts the power efficiency of the load switch. An nMOS transistor has a much lower channel resistance which is beneficial for power efficiency, but requires the use of charge pump which results in greater complexity, die size, and higher quiescent power consumption (power consumed by the load switch control circuitry itself).

In accordance with the embodiments disclosed herein, a load switch is provided that uses an nMOS power transistor. The disclosed load switch includes a charge pump and an associated oscillator as well as a current driver. The nMOS transistor is beneficial for its relatively low channel resistance. The load switch also includes a duty cycle controller configured to duty cycle the oscillator, charge pump, and current driver. That is, the duty cycle controller turns the oscillator, charge pump, and current driver on and off while continuing to maintain the nMOS transistor in an on state. When the output voltage of the driver, which is provided to the gate of the nMOS transistor, is above a threshold, the duty cycle controller disables (e.g., turns off) any or all of the oscillator, charge pump, and current driver circuits. As a result, the output voltage of the current driver begins to decrease, and when the driver voltage (i.e., nMOS transistor gate voltage) drops below the threshold (or a different threshold if hysteresis is included in the duty cycle controller), the duty cycle controller turns back on the oscillator, charge pump, and current driver to cause the output voltage of the current driver to increase. The process repeats. In some embodiments, the oscillator, charge pump, and current driver circuits may be turned off 90% of the time and on 10% of the time thereby resulting in a 90% reduction of the average quiescent current (or power) in the load switch compared to not duty cycling the oscillator, charge pump, and current driver.

FIG. 1 shows an example of a load switch 100 in accordance with an embodiment. The illustrative load switch 100 includes an input voltage (VIN) which is provided through a power transistor M1 to an output node (VOUT). A load (not shown in FIG. 1) may be coupled to the VOUT node and provided operational power by the load switch. That is, the load switch 100 may be enabled (turned on) to provide the VIN voltage to the load as VOUT, or disabled (turned off) to turn off power to the load.

The load switch of the example of FIG. 1 also includes an oscillator circuit 102 (referred to herein as the oscillator), a charge pump circuit 104 (referred to herein as a charge pump), and a driver circuit 106 (referred to herein as a driver). The oscillator 102 provides an oscillating signal 103 to the charge pump 104. The charge pump 104 receives VIN and the oscillating signal 103 and, based on VIN and the oscillating signal 103, generates a voltage on its output 105 that may be larger than VIN. The driver 106 may be a current driver that provides voltage and current on its output 107 to the gate G1 of the power transistor M1 to turn the power transistor on or off as specified by a control signal (CTL) provided to the driver 106. The driver 106 may be implemented as a current driver.

In accordance with some embodiments, the power transistor M1 may comprise an nMOS transistor. As explained above, nMOS transistors have a lower drain-to-source resistance ($R_{DS}$) than a pMOS transistor of comparable dimensions. Lower drain-to-source resistance advantageously results in higher power efficiency. However, because nMOS transistors are turned on with a gate voltage that is higher than the source voltage (VIN for the load switch of FIG. 1), the charge pump 104 is included to produce a sufficiently large voltage (larger than VIN) for the gate G1 of the power transistor M1. Further, to operate a charge pump, an oscillator 102 is included as well, and the driver 106 provides sufficient drive current to the gate G1. These circuits—oscillator 102, charge pump 104, and driver 106—require electrical current for their operation. The total of the current through these three circuits is part of the "quiescent current" in the load switch. The quiescent current is that portion of the input current from VIN to the load switch 100 that does not flow through to the load. Quiescent current does not help the load function at all and simply is used by the switch itself. The embodiments described herein reduce the average amount of quiescent current in the load switch by duty cycling the oscillator 102, the charge pump 104, and the driver 106. In some embodiments, all three of the oscillator 102, the charge pump 104, and the driver 106 are duty cycled synchronously meaning that all three elements are turned on an off in unison. In other embodiments, only one or two of the oscillator 102, the charge pump 104, and the driver 106 is duty cycled with the remaining device(s) left on (i.e., not duty cycled). A transistor switch may be included in each of the oscillator 102, the charge pump 104, and the driver 106 to receive an enable signal to turn each such circuit on and off.

FIG. 1 illustrates that the load switch 100 includes a duty cycle controller 120. The duty cycle controller 120 receives the input voltage VIN as well as the voltage on gate G1 of the power transistor M1. The duty cycle controller 120 generates an enable signal 121 to each of the oscillator 102, charge pump 104, and driver 106. In accordance with an embodiment, the duty cycle controller 120 internally generates a reference signal which it compares to a signal indicative of the voltage on the gate G1 of the power transistor M1. Based on whether the signal indicative of the gate G1 voltage is larger or smaller than the reference signal, the duty cycle controller 120 duty cycles the charge pump 104 as well as the oscillator 102 and driver 106. In one embodiment, the duty cycle controller 120 disables the oscillator 102, charge pump 104, and driver 106 based on the signal indicative of the gate G1 voltage being greater than the reference signal, and enables the oscillator 102, charge pump 104, and driver 106 based on the signal indicative of the gate G1 voltage being smaller than the reference signal. By duty cycling the oscillator 102, charge pump 104, and driver 106, the average quiescent current in the load switch 100 is reduced compared to having the oscillator 102, charge pump 104, and driver 106 remain on and not duty cycled. In one embodiment, the power transistor M1 is an nMOS transistor and the oscillator 102, charge pump 104, and driver 106 are duty cycled. As such, the channel resistance through the power transistor is relatively low, as is the quiescent current due to the duty cycling implemented by the duty cycle controller 120.

Figure 2:
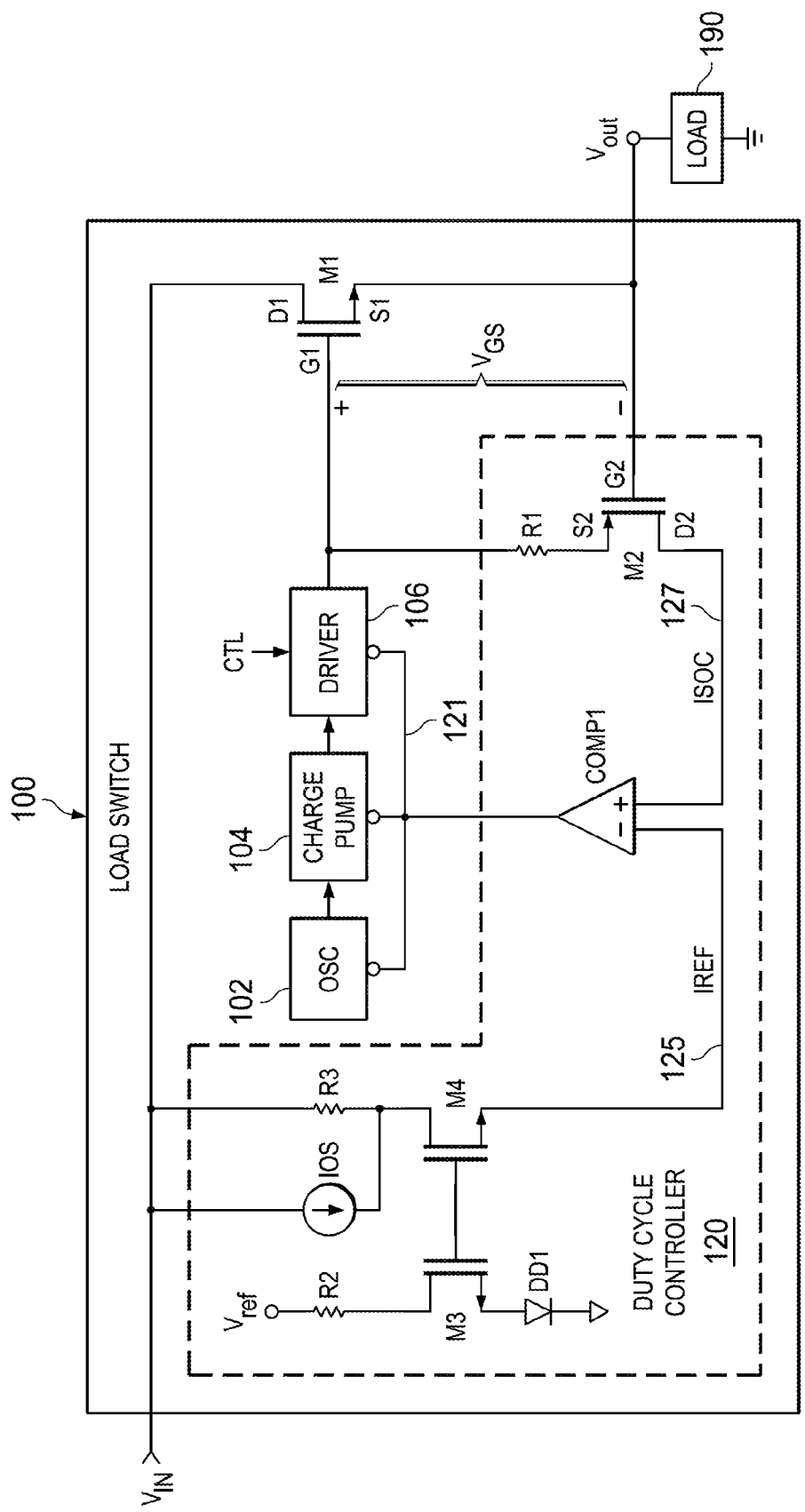
FIG. 2 shows a further implementation of the load switch of FIG. 1 in accordance with an embodiment.

FIG. 2 illustrates a further implementation of the load switch 100 of FIG. 1. In FIG. 2, the load switch 100 includes the duty cycle controller 120 coupled to the oscillator 102, charge pump 104, and driver 106 via an enable signal 121. A load 190 is shown coupled to the source S1 of the power transistor M1. When turned on, the input voltage VIN is provided through power transistor M1 to the load 190 to operate the load.

The duty cycle controller 120 includes a comparator COMP1, resistors R1, R2, and R2, transistors M2, M3, and M4, diode DD1 and an offset current source 105. The comparator may be a current comparator. Resistor R1 is coupled to the gate G1 of the power transistor M1. Transistor M2 may be a field effect transistor (FET) such as pMOS transistor and includes gate G2, drain D2, and source S2. The gate G2 of the transistor M2 is coupled to the load 190 and the drain D2 is coupled to an input of the comparator COMP1. In some embodiments and as shown in FIG. 2, the drain D2 of the transistor M2 is coupled to a positive (+) input of comparator COMP1.

Transistors M3 and M4 form a current mirror that is configured to generate the reference signal 125 which is provided to the negative (−) input of the comparator COMP1. In some embodiments, the reference signal is a current reference and is designated in FIG. 2 as IREF 125. A reference voltage VREF is generated internal to the duty cycle controller 120 and is provided to transistor M3 through resistor R2 as shown. The magnitude of the current through resistor R2 to transistor M3 is VREF/R2. The input voltage VIN is coupled to transistor M4 through resistor R3. The offset current source 105 is coupled in parallel to the resistor R3. Transistor M3 thus receives the sum of the offset current

105 and the current derived from the input voltage by way of resistor R3. The current through resistor R3 is VIN/R3.

The reference current IREF 125 is generated by the current mirror formed from transistors M3 and M4 as the lower of:
- a current derived from reference voltage VREF (e.g., VREF/R2), and
- a current that is the sum of offset current IOS and the current derived from the input voltage (e.g., VIN/R3).

As such, the current mirror formed by transistors M3 and M4 implements a minimum function to generate the reference signal IREF 125. The minimum function permits the load switch to operate through a wide range of input voltages (e.g., 0.9 V to 6V) without permitting the gate voltage to the power transistor M1 to become too large.

Referring still to FIG. 2, the gate G1 of the power transistor M1 is connected to resistor R1 while the source S1 of the power transistor M1 is connected to the gate G2 of transistor M2. Thus, as shown the gate-to-source voltage (VGS) of the power transistor M1 is provided across resistor R1 and the gate G2 of transistor M2. The transistor M2 has a threshold voltage above which the transistor can be made to turn and below which the transistor remains off. As such, no current flows through resistor R1 and transistor M2 unless VGS is higher than the threshold voltage of transistor M2. When VGS is lower than the threshold voltage of transistor M2, ISOC is low (e.g., zero). When VGS is greater than the transistor's threshold voltage, the current (ISOC) flows through the resistor R1 and transistor M2 and is given by (VGS-threshold voltage)/R1.

The comparator COMP1 compares IREF 125 to ISOC 127. The comparator COMP1 may implement hysteresis. In the embodiment of FIG. 2, based on ISOC 127 being greater than IREF 125, the output of the comparator COMP1 will be high. The enable inputs to the oscillator 102, charge pump 104, and driver 106 are active low in this example, and thus a high enable signal 121 disables the oscillator 102, charge pump 104, and driver 106. With the charge pump 104 disabled, its output voltage to the driver 106 begins to decrease which in turn causes the voltage on the gate G1 of the power transistor M1 to decrease as well, although the voltage on G1 still will be high enough to keep the power transistor M1 in on condition. As VGS begins to drop, at some point VGS becomes lower than threshold voltage of transistor M2 which causes M2 to turn off thereby forcing ISOC to a level that is lower than IREF. With ISOC lower than IREF, the output of COMP1 will become low thereby enabling the oscillator 102, charge pump 104, and driver 106, which causes the charge pump voltage and gate G1 voltage to increase keeping the power switch M1 on. In another embodiment, the enable inputs to the oscillator 102, charge pump 104, and driver 106 are active high, in which case the IREF 125 input is provided to the positive comparator input and ISOC 127 is provided to the negative comparator input.

Figure 3:
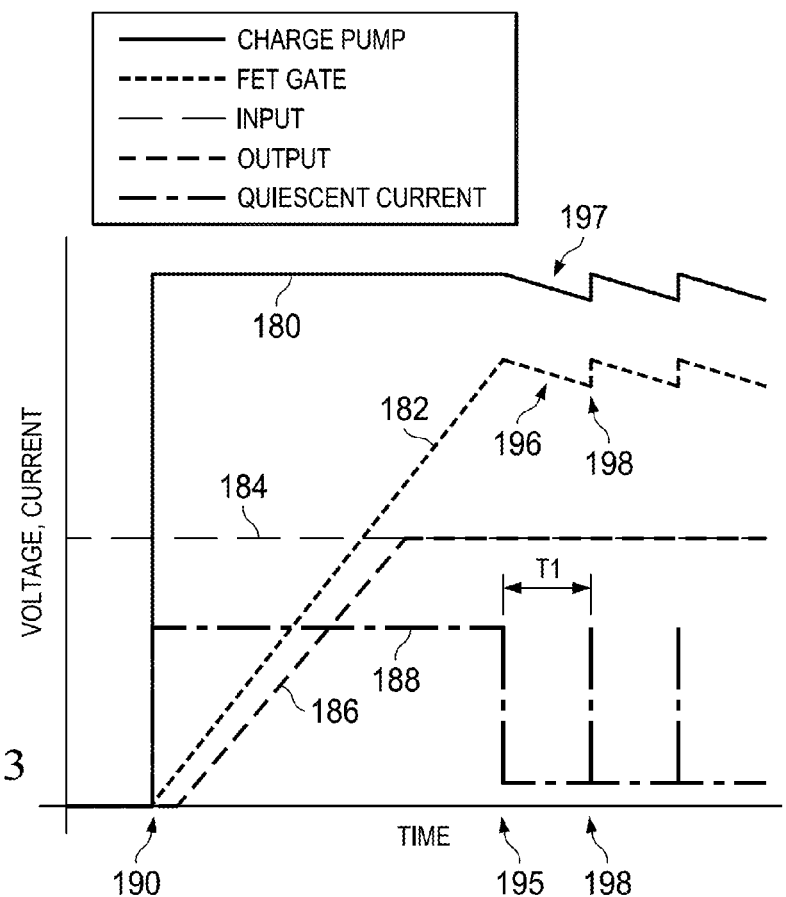
FIG. 3 illustrates the various electrical signal waveforms of the load switch accordance with an embodiment.

FIG. 3 illustrates the progression over time of some of the relevant voltages and currents in the load switch 100 of FIG. 2. The charge pump output voltage 180 is shown along with the voltage on the gate G1 of the power transistor M1 (182), the input voltage VIN 184, the output voltage VOUT to the load 186 and the quiescent current 188 in the load switch 100. The input voltage 184 is maintained at a constant level as shown. At 190, the control (CTL) signal to the driver 106 is asserted to cause the load switch 100 to provide power to the load. Assertion of the CTL signal, which is controlled by external logic not shown, causes the power transistor's gate voltage 182 to begin to increase linearly as shown. The output voltage also increases until it reaches the level of the input voltage and remains constant thereafter also as shown.

At point 195, the gate voltage increases to a high enough level that ISOC exceeds IREF thereby causing the duty cycle controller 120 (and comparator COMP1 more specifically) to disable the oscillator 102, charge pump 104, and driver 106. As indicated by reference numerals 196 and 197, with the oscillator 102, charge pump 104, and driver 106 turned off, the charge pump voltage 180 and gate voltage 182 decrease linearly. At 198, ISOC falls below IREF thereby causing the duty cycle controller 120 (COMP1) to turn on the oscillator 102, charge pump 104, and driver 106. The charge pump voltage 180 and gate G1 voltage 182 jump up as a result, and the process repeats thereby resulting in a saw tooth shape to the charge pump voltage and gate G1 voltage waveforms.

During time period T1, the oscillator 102, charge pump 104, and driver 106 are turned off thereby resulting in substantial drop in quiescent current of the load switch 100. Oscillator 102, charge pump 104, and driver 106 are then turned back on briefly which results in a spike in the quiescent current as shown. In some examples, the duty cycle of the quiescent current waveform may be 1% meaning that the oscillator 102, charge pump 104, and driver 106 are on only about 1% of the time, resulting in a substantial decrease in the average quiescent current during operation of the load switch.

Duty cycling the driver's output voltage (gate G1 voltage) helps to protect the gate oxide of the power transistor M1 and improves light-load efficiency. The charge pump voltage 180 in FIG. 3 is shown to be larger than the gate G1 voltage 182. That voltage difference can be reduced as desired to further improve efficiency.

The VGS gate voltage of the power transistor M1 is scaled down at lower levels of VIN due to the fact that IREF is derived from VIN—lower VIN levels results in lower IREF levels as well. VGS advantageously is scaled down to keep the number of stages of the charge pump 104 stages to a lower number to control die area, power consumption and robustness of the charge pump 104.

Figure 4:
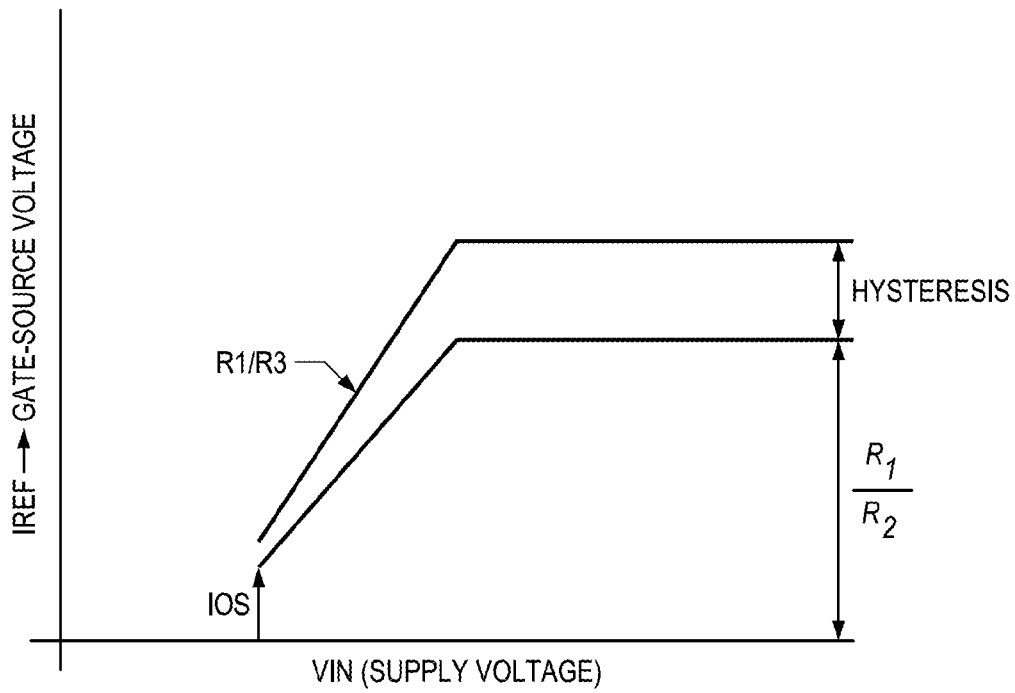
FIG. 4 illustrates various control points for the gate-to-source voltage of the power transistor of the load switch in accordance with an embodiment.

FIG. 4 illustrates the shape of VGS and is determined by three points of control. First, the offset current IOS adjusts VGS at a lower VIN operating voltage. Since IOS is added to the current through resistor R3 (which itself is based on VIN), at minimum levels of VIN, IREF is dictated largely by IOS. Second, the ratio of R1/R2 controls VGS at higher supply voltage (VIN) levels. Third, the ratio of R1/R3 controls the slope of VGS at lower levels of VIN.

Figure 5:
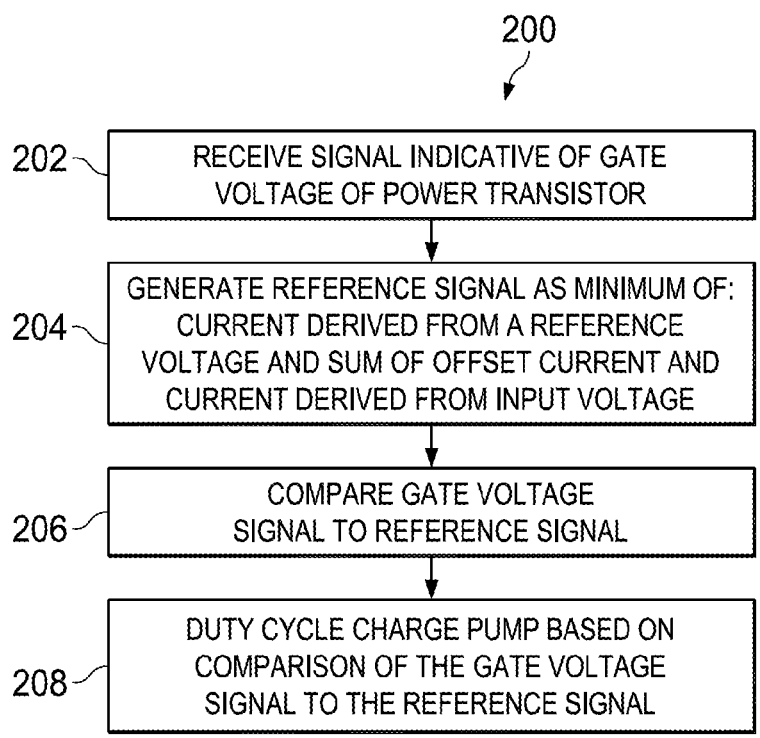
FIG. 5 illustrates a method in accordance with an embodiment.

FIG. 5 illustrates a method in accordance with various embodiments. The operations may be performed in the order shown or in a different order. Further, two or more of the operations may be performed in parallel rather than sequentially. At 202, the method includes receiving a signal indicative of a voltage of a gate of a power transistor configured to switch an input voltage to a load. For example, the positive (+) input of the comparator COMP1 may receive the ISOC current 127 which runs from the gate G1 of the power transistor M1 through resistor R1 and transistor M2. At 204, the method includes generating a reference signal as the minimum of a current derived from a reference voltage and the sum of an offset current plus a current derived from the input voltage. In some embodiments, this operation may be implemented by the current mirror (M3 coupled to M4) generating the IREF current reference signal as the lower of VREF/R1 and ISCO+VIN/R3.

At 206, the method includes comparing the signal indicative of the gate voltage to a reference signal. In the example of FIG. 3 this may include the current comparator COMP1 comparing ISOC 127 to IREF 125. At 208, the method includes duty cycling the charge pump 104 (configured to turn on the power transistor M1) based on the comparison of the signal indicative of the gate voltage (e.g., ISOC current) to the reference signal (IREF current).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A switch, comprising:
a power transistor configured to switch an input voltage to a load;
a charge pump coupled to the power transistor, the charge pump including an enable input to cause the charge pump to be turned on and off; and
a duty cycle controller coupled to the charge pump and configured to duty cycle the charge pump based on a comparison of a signal of a gate of the power transistor to a reference signal, the duty cycle controller including:
a comparator configured to compare the signal of the gate of the power transistor to the reference signal;
a resistor coupled to the gate of the power transistor; and
a field effect transistor (FET) including a gate, a source and a drain, in which the source is coupled to the resistor, the gate of the FET is coupled to the load, and the drain of the FET is coupled to an input of the comparator.

2. The switch of claim 1, wherein the power transistor is an re-channel metal oxide semiconductor (nMOS) transistor.

3. The switch of claim 1, wherein the duty cycle controller includes a current comparator.

4. The switch of claim 3, wherein the current comparator is configured to compare a current generated from a voltage of the gate of the power transistor to a reference current.

5. The switch of claim 3, further comprising a current mirror configured to generate, as the reference signal, the lower of: a current derived from a reference voltage; and a current that is a sum of an offset current and a current derived from the input voltage.

6. The switch of claim 1, wherein the duty cycle controller is configured to disable the charge pump upon a determination that the signal of the gate of the power transistor is above the reference signal and to enable the charge pump upon a determination that the signal of the gate of the power transistor is below the reference signal.

7. The switch of claim 1, further comprising an oscillator and a driver, wherein the driver is coupled to the gate of the power transistor and wherein the duty cycle controller is coupled to the oscillator and the driver and configured to duty cycle the oscillator, charge pump, and driver based on the comparison of the signal of the gate of the power transistor to the reference signal.

8. An apparatus, comprising:
a load;
a power transistor coupled to the load and configured to switch an input voltage to the load to power the load;
a charge pump coupled to the power transistor, the charge pump including an enable input to cause the charge pump to be turned on and off;
a comparator coupled to the charge pump and configured to generate an enable signal to the charge pump to turn the charge pump on and off based on a comparison of a signal of a gate of the power transistor to a reference signal to duty cycle the charge pump; and
a resistor coupled to the gate of the power transistor and to a field effect transistor (FET), the FET including a gate that is coupled to the load and drain that is coupled to an input of the comparator.

9. The apparatus of claim 8 wherein the comparator is a current comparator.

10. The apparatus of claim 8 further including a circuit that generates the reference signal as a minimum of the lower of:
a current derived from a reference voltage; and
a current that is based on a current derived from the input voltage.

11. The apparatus of claim 8 further including a circuit that generates the reference signal as a minimum of the lower of:
a current derived from a reference voltage; and
a current that is a sum of an offset current and a current derived from the input voltage.

12. The apparatus of claim 8 including an oscillator and a driver, the driver is coupled to the gate of the power transistor and the comparator is coupled to the oscillator and the driver and configured to provide the enable signal to the oscillator, charge pump, and driver to synchronously turn on and off the oscillator, charge pump, and driver.

13. The apparatus of claim 8 wherein the power transistor is an re-channel metal oxide semiconductor (nMOS) transistor.

14. A method, comprising:
receiving a signal indicative of a voltage of a gate of a power transistor configured to switch an input voltage to a load;
comparing the signal indicative of the gate voltage to a reference signal, including comparing a current derived from the gate voltage to a current reference signal;
duty cycling a charge pump configured to turn on the power transistor based on the comparison of the signal indicative of the gate voltage to the reference signal; and
generating the current reference signal as the lower of:
a current derived from a reference voltage; and
a current that is a sum of an offset current and a current derived from the input voltage.

* * * * *